United States Patent
Kondou et al.

(10) Patent No.: US 8,039,968 B2
(45) Date of Patent: Oct. 18, 2011

(54) SEMICONDUCTOR INTEGRATED CIRCUIT DEVICE

(75) Inventors: Hideaki Kondou, Kyoto (JP); Hiromasa Fukazawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 12/391,359

(22) Filed: Feb. 24, 2009

(65) Prior Publication Data

US 2009/0230562 A1    Sep. 17, 2009

(30) Foreign Application Priority Data

Mar. 11, 2008 (JP) .................. 2008-061665
Feb. 16, 2009 (JP) .................. 2009-032318

(51) Int. Cl.
*H01L 23/48* (2006.01)

(52) U.S. Cl. ........ 257/774; 257/410; 257/751; 257/752; 257/531; 257/522; 257/E23.011

(58) Field of Classification Search .................. 257/774, 257/E23.011, 410, 751, 752, 531, 522
See application file for complete search history.

(56) References Cited

U.S. PATENT DOCUMENTS

| | | | |
|---|---|---|---|
| 6,717,267 B1 | 4/2004 | Kunikiyo | |
| 7,200,831 B2 | 4/2007 | Kitabayashi | |
| 7,439,623 B2 | 10/2008 | Harada | |
| 2001/0040301 A1 | 11/2001 | Miyako | |
| 2002/0070453 A1 | 6/2002 | Yamamoto | |
| 2002/0074660 A1 | 6/2002 | Fukasawa | |
| 2004/0084777 A1 | 5/2004 | Yamanoue et al. | |
| 2004/0222528 A1 | 11/2004 | Kunikiyo | |
| 2007/0158849 A1 | 7/2007 | Higashi et al. | |
| 2007/0262454 A1 | 11/2007 | Shibata | |

FOREIGN PATENT DOCUMENTS

| | | |
|---|---|---|
| JP | 05-144809 | 6/1993 |
| JP | 06-085080 | 3/1994 |
| JP | 06085080 | * 3/1994 |
| JP | 11-031727 | 2/1999 |
| JP | 2001-053148 | 2/2001 |
| JP | 2001-196372 | 7/2001 |
| JP | 2002-184950 | 6/2002 |
| JP | 2002-270776 | 9/2002 |
| JP | 2004-153015 | 5/2004 |
| JP | 2005-135971 | 5/2005 |

(Continued)

OTHER PUBLICATIONS

Japanese Office Action, with English translation, issued in Japanese Patent Application No. 2009-032318, mailed Aug. 3, 2010.

*Primary Examiner* — Long Pham
(74) *Attorney, Agent, or Firm* — McDermott Will & Emery LLP

(57) ABSTRACT

A semiconductor integrated circuit device including a dummy via is disclosed. In the semiconductor integrated circuit device, problems such as reduction in the designability and increase in fabrication cost which result from the existence of a dummy wire connected to the dummy via are suppressed. The semiconductor integrated circuit device includes a substrate and three or more wiring layers formed on the substrate. The dummy via connects between a first wiring layer and a second wiring layer. The dummy wire connected to the dummy via exists in the second wiring layer. A protrusion amount of the dummy wire is smaller than a protrusion amount of an intermediate wire included in a stacked via structure.

8 Claims, 7 Drawing Sheets

FOREIGN PATENT DOCUMENTS

| | | |
|---|---|---|
| JP | 2005-158803 | 6/2005 |
| JP | 2005-191540 | 7/2005 |
| JP | 2006-179816 | 7/2006 |
| JP | 2007-035771 | 2/2007 |
| JP | 2007035771 * | 8/2007 |
| JP | 2007-305713 | 11/2007 |

* cited by examiner

SEMICONDUCTOR INTEGRATED CIRCUIT DEVICE

CROSS-REFERENCE TO RELATED APPLICATIONS

This application claims priority from Japanese Patent Applications No. 2008-61665 filed on Mar. 11, 2008 and No. 2009-32318 filed on Feb. 16, 2009, which are hereby incorporated by reference in its entirety for all purposes.

BACKGROUND

The present disclosure relates to a wiring structure of a semiconductor integrated circuit device which includes multilayer wiring layers.

As a result of the progress in miniaturization, the techniques of positioning a dummy via have been used in the semiconductor fabrication process to increase uniformity of a multilayer wiring structure when forming a via hole. Specifically, physical restrictions on via density for assuring planarization are determined as design rules for layout design, and a dummy via is positioned to meet the physical restrictions on via density. The dummy via avoids isolation of an effective via and contributes to achieve a planar device surface.

Japanese Laid-Open Patent Application Publication No. 2007-305713 discloses an example technique of positioning a dummy via efficiently.

SUMMARY

When positioning a dummy via, a dummy wire connected to the dummy via needs to be formed together with the dummy via for reasons of fabrication process or layout design. For example, there is a fabrication process, such as dual damascene process, in which a via and a wire connected to the via are formed at the same time. Furthermore, many of existing EDA tools automatically position a via and a wire connected to the via, considering them as one component.

However, the area occupied by this dummy wire may affect the layout of necessary wires, such as signal wires. For example, it is difficult to form a dummy wire in an area where signal wires densely exist. Thus, measures need to be taken by, for example, making some of the wires detour around the dense area or increasing the area of the wires to decrease the wire density. However, such detour of wires increases the length of the wires to result in signal delay and reduction in the designability. Similarly, if the area of the wires is increased, it increases the chip area to result in increase in fabrication cost.

In view of the above circumstances, the present invention may be advantageous in suppressing problems, such as reduction in the designability and increase in fabrication cost which result from the existence of a dummy wire connected to a dummy via, in a semiconductor integrated circuit device including the dummy via.

The present invention may be advantageous in decreasing the dimensions of a dummy wire connected to a dummy via as much as possible.

Specifically, a semiconductor integrated circuit device of the present invention includes: a substrate; three or more wiring layers on the substrate; a dummy via between adjacent first and second wiring layers of the three or more wiring layers; a dummy wire formed in the second wiring layer and connected to the dummy via; and one or more stacked via structures formed in the three or more wiring layers and each including an intermediate wire in the second wiring layer, wherein a protrusion amount of the dummy wire is smaller than a protrusion amount of the intermediate wire in any of the stacked via structures.

According to the present invention, a protrusion amount of the dummy wire connected to the dummy via is smaller than a protrusion amount of the intermediate wire, which is formed in the same wiring layer as the dummy wire, in any of the stacked via structures. This, for example, enables easy arrangement of the dummy wire in an area where wires densely exist, and therefore, measures such as making some of the wires detour around the dense area or increasing the area of the wires are less necessary. As a result, it is possible to suppress problems such as reduction in the designability and increase in fabrication cost more than it was possible.

A semiconductor integrated circuit device of the present invention includes: a substrate; three or more wiring layers on the substrate; a dummy via between adjacent first and second wiring layers of the three or more wiring layers; a dummy wire formed in the second wiring layer and connected to the dummy via; and one or more stacked via structures formed in the three or more wiring layers and each including an intermediate wire in the second wiring layer, wherein an area of the dummy wire is smaller than an area of the intermediate wire in any of the stacked via structures.

According to the present invention, an area of the dummy wire connected to the dummy via is smaller than an area of the intermediate wire, which is formed in the same wiring layer as the dummy wire, in any of the stacked via structures. This, for example, enables easy arrangement of the dummy wire in an area where wires densely exist, and therefore, measures such as making some of the wires detour around the dense area or increasing the area of the wires are less necessary. As a result, it is possible to suppress problems such as reduction in the designability and increase in fabrication cost more than it was possible.

As described in the above, the present invention makes it possible to suppress problems, such as reduction in the designability and increase in fabrication cost which result from the existence of a dummy wire connected to a dummy via, more than it was possible.

BRIEF DESCRIPTION OF THE DRAWINGS

FIG. 1 shows an example structure of a semiconductor integrated circuit device according to the first embodiment.

FIG. 5 shows an example structure of a semiconductor integrated circuit device according to the fourth embodiment.

FIG. 6 shows an example structure of a semiconductor integrated circuit device according to the fifth embodiment.

FIG. 8 shows an example structure of a semiconductor integrated circuit device according to the sixth embodiment.

FIG. 9 shows an example structure of a semiconductor integrated circuit device according to the seventh embodiment.

DETAILED DESCRIPTION

Embodiments of the present invention are hereinafter described in detail based on the drawings.

First Embodiment

Figure 1A:
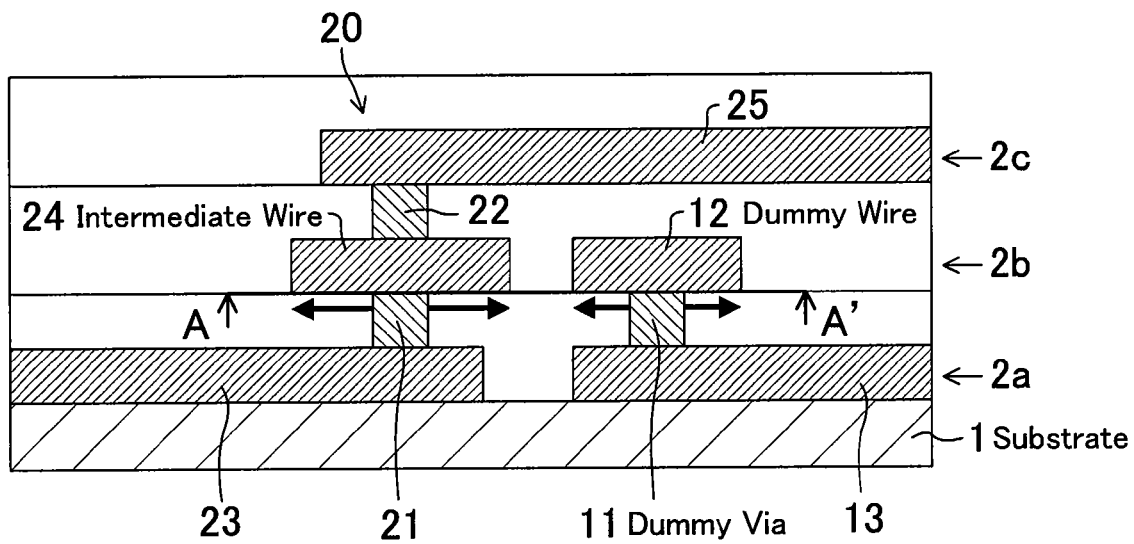
FIG. 1A is a vertical cross section and FIG. 1B is a plan view.
Figure 1B:
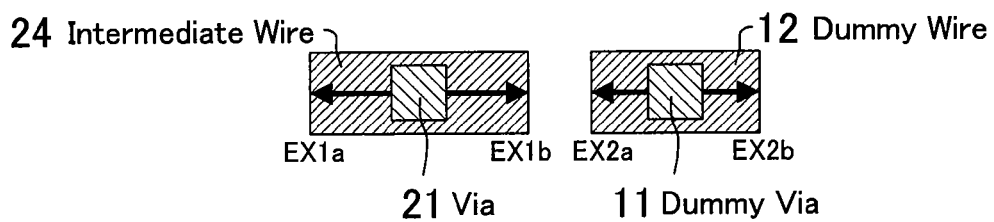

FIG. 1 shows an example structure of a semiconductor integrated circuit device according to the first embodiment. FIG. 1A is a vertical cross section and FIG. 1B is a plan view taken along the line A-A' of FIG. 1A. As shown in FIG. 1, the semiconductor integrated circuit device of the present embodiment includes a substrate 1 and three or more wiring layers formed on the substrate 1. The wiring layers are labeled as 2a, 2b and 2c in FIG. 1.

A dummy via 11 exists between the wiring layer 2a (first wiring layer) and the wiring layer 2b (second wiring layer). The dummy via 11 connects between a wire 13 formed in the wiring layer 2a and a dummy wire 12 formed in the wiring layer 2b. A stacked via structure 20 is formed in the wiring layers 2a through 2c. The stacked via structure 20 includes: a via 21 between the wiring layers 2a and 2b; a via 22 between the wiring layers 2b and 2c; a wire 23 formed in the wiring layer 2a and connected to the via 21; an intermediate wire 24 formed in the wiring layer 2b and connected to the vias 21 and 22; and a wire 25 formed in the wiring layer 2c and connected to the via 22.

In the present specification the term "dummy via" refers to a via that does not contribute to signal transmission and power supply, and "dummy wire" refers to a wire that is connected only to a dummy via. The term "stacked via structure" refers to a via structure in which a plurality of vias are stacked substantially perpendicularly to the substrate surface. The term "intermediate wire" included in the stacked via structure refers to a wire to which only two vias, the vias being stacked substantially perpendicularly to the substrate surface, are connected such that the wire is vertically sandwiched between the two vias.

Minimum dimensions of wires have been conventionally defined in the semiconductor fabrication process. In general, an intermediate wire in a stacked via structure is of minimum dimensions defined in the fabrication process. In the present embodiment, the dummy wire connected to the dummy via is of dimensions much smaller than the minimum dimensions. In other words, the semiconductor integrated circuit device of the present embodiment is characterized in that the dummy wire connected to the dummy via is smaller than the intermediate wire which is included in the stacked via structure and which is formed in the same wiring layer as the dummy wire. This, for example, enables easy arrangement of the dummy wire in an area where wires densely exist, and therefore, measures such as making some of the wires detour around the dense area or increasing the area of the wires are less necessary. As a result, it is possible to suppress problems such as reduction in the designability and increase in fabrication cost more than it was possible.

The dimensions of an intermediate wire in a stacked via structure need to include margins for assuring the reliability of signal transmission between the two vias by which the intermediate wire is vertically sandwiched. On the contrary, the dimensions of a dummy wire connected to a dummy via do not need to include margins for assuring the reliability of signal transmission because the dummy via does not contribute to signal transmission. For this reason even if the dummy wire is smaller than the intermediate wire included in the stacked via structure, it does not cause any particular problems in terms of the reliability of the semiconductor integrated circuit device.

According to an example of the present embodiment, the protrusion amount of the dummy wire 12 connected to the dummy via 11 is smaller than the protrusion amount of the intermediate wire 24 in the stacked via structure 20. The term "protrusion amount" as used herein refers to a longer one of two averages of distances from via ends to wire ends respectively along two orthogonal directions along which a wire extends. In the case where the wire is a rectangle in plan view, the protrusion amount is the average of distances from via ends to wire ends along a longer axis of the rectangle.

Referring to FIG. 1B, the protrusion amount of the intermediate wire 24 is the average of the distance EX1a from an end of the via 21 to an end of the intermediate wire 24 and the distance EX1b from the opposite end of the via 21 to the opposite end of the intermediate wire 24. The protrusion amount of the dummy wire 12 is the average of the distance EX2a from an end of the dummy via 11 to an end of the dummy wire 12 and the distance EX2b from the opposite end of the dummy via 11 to the opposite end of the dummy wire 12. The protrusion amount of the dummy wire 12, that is (EX2a+EX2b)/2, is smaller than the protrusion amount of the intermediate wire 24, that is (EX1a+EX1b)/2.

Figure 2:
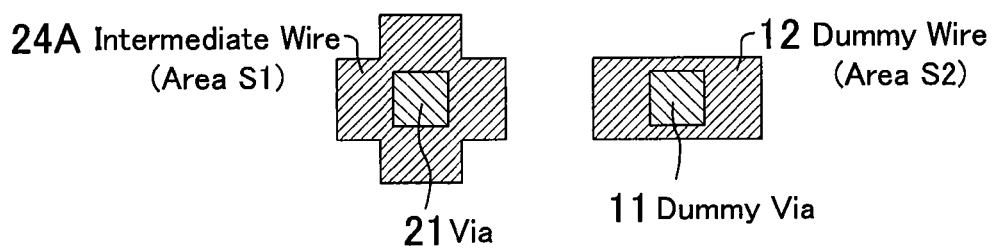
FIG. 2 is a plan view showing other example shapes of an intermediate wire and a dummy wire according to the first embodiment.

Alternatively, the protrusion amount of the dummy wire and the protrusion amount of the intermediate wire may be compared in terms of the area. For example, in the case where the intermediate wire 24A is cross-shaped as shown in FIG. 2, the protrusion amount of the intermediate wire 24A may be considered smaller than the protrusion amount of the dummy wire 12 if compared in terms of the distance. The effects as mentioned in the above are obtainable even in this structure, as long as the area S2 of the dummy wire 12 is smaller than the area S1 of the intermediate wire 24A. Thus, according to an example of the present embodiment, the area of the dummy wire 12 connected to the dummy via 11 is smaller than the area of the intermediate wire 24A in the stacked via structure 20.

Second Embodiment

Figure 3:
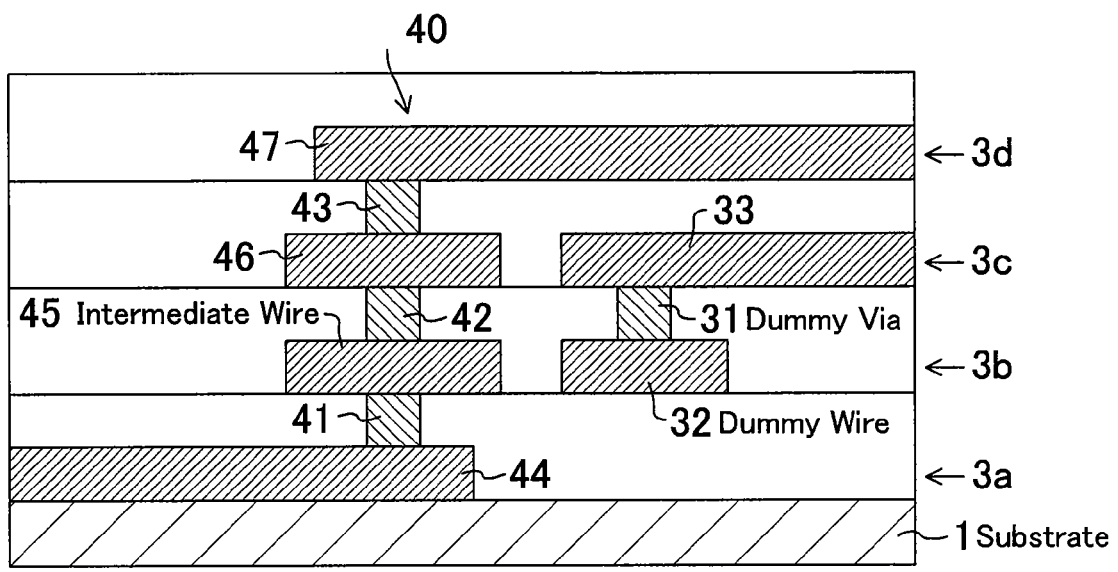
FIG. 3 is a vertical cross section of an example structure of a semiconductor integrated circuit device according to the second embodiment.

FIG. 3 is a vertical cross section of an example structure of a semiconductor integrated circuit device according to the second embodiment. As shown in FIG. 3, the semiconductor integrated circuit device of the present embodiment includes a substrate 1 and three or more wiring layers formed on the substrate 1. The wiring layers are labeled as 3a, 3b, 3c and 3d in FIG. 3.

A dummy via 31 exists between the wiring layer 3c (first wiring layer) and the wiring layer 3b (second wiring layer). The dummy via 31 connects between a wire 33 formed in the wiring layer 3c and a dummy wire 32 formed in the wiring layer 3b. A stacked via structure 40 is formed in the wiring layers 3a through 3d. The stacked via structure 40 includes: a via 41 between the wiring layers 3a and 3b; a via 42 between the wiring layers 3b and 3c; a via 43 between the wiring layers 3c and 3d; a wire 44 formed in the wiring layer 3a and connected to the via 41; an intermediate wire 45 formed in the wiring layer 3b and connected to the vias 41 and 42; an intermediate wire 46 formed in the wiring layer 3c and connected to the vias 42 and 43; and a wire 47 formed in the wiring layer 3*d* and connected to the via 43.

According to an example of the present embodiment, a protrusion amount of the dummy wire 32 connected to the dummy via 31 is smaller than a protrusion amount of the intermediate wire 45 which is included in the stacked via structure 40 and which is formed in the same wiring layer 3*b* as the dummy wire 32. Alternatively, the area of the dummy wire 32 is smaller than the area of the intermediate wire 45.

According to the first embodiment, the dummy wire 12 exists in the wiring layer 2*b* above the dummy via 11. However, according to the present embodiment, the dummy wire 32 exists in the wiring layer 3*b* below the dummy via 31. Needless to say, the same effects as in the first embodiment are obtainable in this structure too.

Third Embodiment

Figure 4:
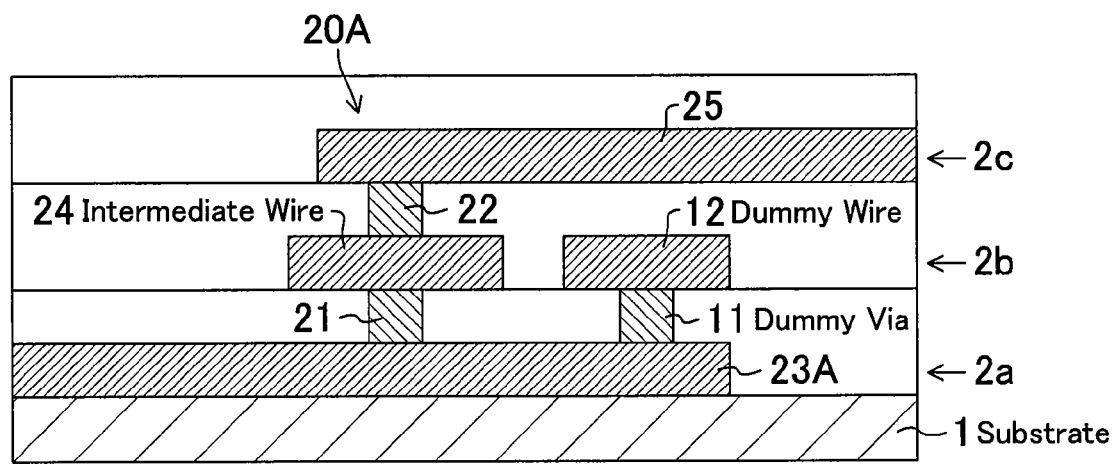
FIG. 4 is a vertical cross section of an example structure of a semiconductor integrated circuit device according to the third embodiment.

FIG. 4 is a vertical cross section of an example structure of a semiconductor integrated circuit device according to the third embodiment. The structure of FIG. 4 is almost the same as the structure of FIG. 1A of the first embodiment, and the structural elements of FIG. 4 which are identical to those of FIG. 1A are labeled with the same reference numerals.

The structure of FIG. 4 differs from the structure of FIG. 1A in that the dummy via 11 is connected to a wire 23A which is included in a stacked via structure 20A and which is formed in the wiring layer 2*a*. The same effects as in the first embodiment are obtainable in this structure too, as long as the protrusion amount or the area of the dummy wire 12 connected to the dummy via 11 is smaller than the protrusion amount or the area of the intermediate wire 24 in the stacked via structure 20A.

Fourth Embodiment

Figure 5A:
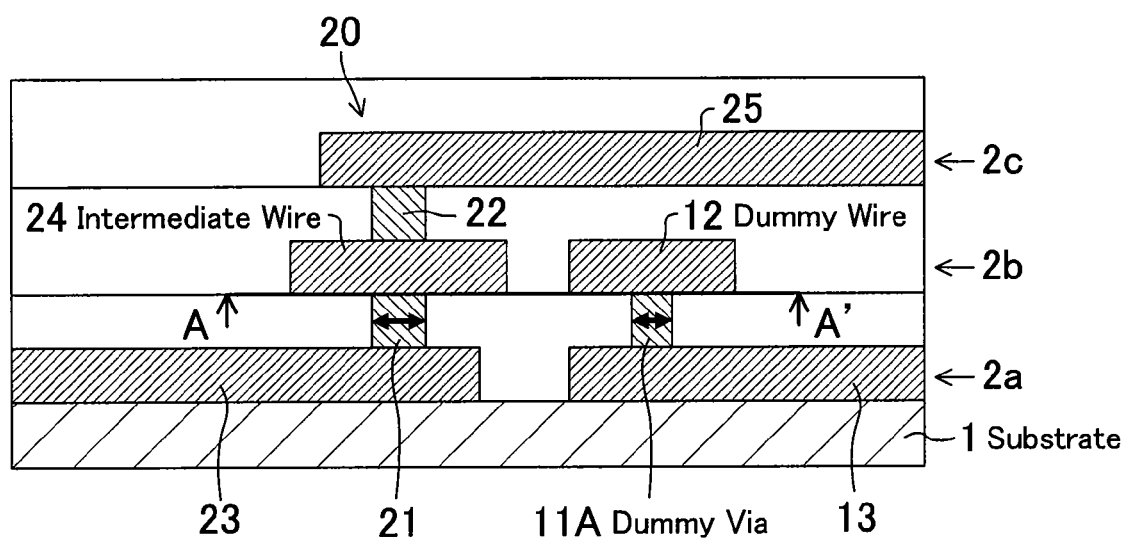
FIG. 5A is a vertical cross section and FIG. 5B is a plan view.
Figure 5B:
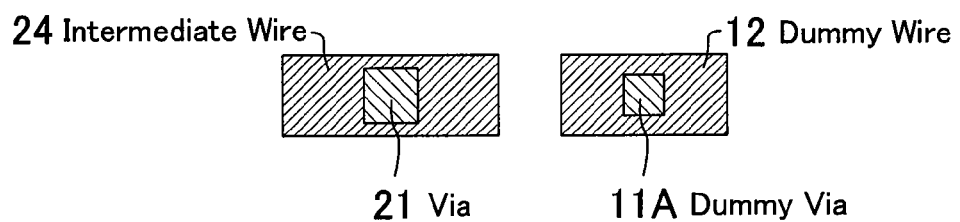

FIG. 5 shows an example structure of a semiconductor integrated circuit device according to the fourth embodiment. FIG. 5A is a vertical cross section and FIG. 5B is a plan view taken along the line A-A' of FIG. 5A. The structure of FIG. 5 is almost the same as the structure of FIG. 1 of the first embodiment, and the structural elements of FIG. 5 which are identical to those of FIG. 1 are labeled with the same reference numerals.

The structure of FIG. 5 differs from the structure of FIG. 1 in that a dummy via 11A has a smaller cross-sectional area than the vias 21 and 22 included in the stacked via structure 20. The same effects as in the first embodiment are obtainable in this structure too, as long as the protrusion amount or the area of the dummy wire 12 connected to the dummy via 11A is smaller than the protrusion amount or the area of the intermediate wire 24 in the stacked via structure 20.

Fifth Embodiment

Figure 6A:
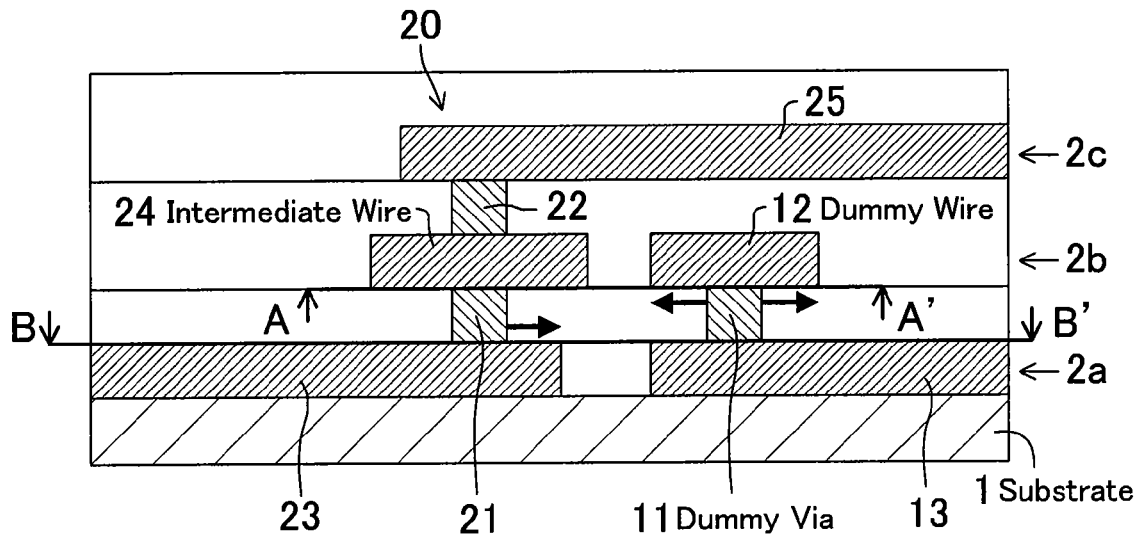
FIG. 6A is a vertical cross section and FIG. 6B and FIG. 6C are plan views.
Figure 6B:
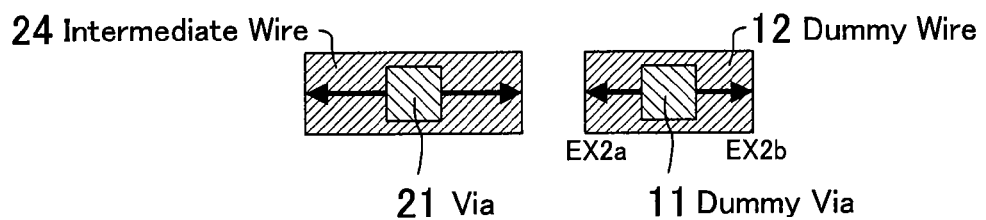
Figure 6C:
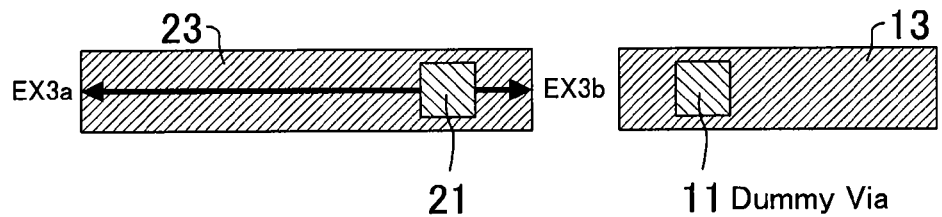

FIG. 6 shows an example structure of a semiconductor integrated circuit device according to the fifth embodiment. FIG. 6A is a vertical cross section; FIG. 6B is a plan view taken along the line A-A' of FIG. 6A; and FIG. 6C is a plan view taken along the line B-B' of FIG. 6A. The structure of FIG. 6 is almost the same as the structure of FIG. 1 of the first embodiment, and the structural elements of FIG. 6 which are identical to those of FIG. 1 are labeled with the same reference numerals.

The structure of FIG. 6 has the same characteristics as the structure of FIG. 1. Specifically, the dummy wire 12 connected to the dummy via 11 is smaller than the intermediate wire 24 which is included in the stacked via structure 20 and which is formed in the same wiring layer 2*b* as the dummy wire 12. Although the structure of FIG. 6 is illustrated as including three wiring layers 2*a* to 2*c*, another wiring layer may be added below the wiring layer 2*a* and/or above the wiring layer 2*c*.

According to the present embodiment, the protrusion amount of the dummy wire 12 is substantially equal to a wire end side protrusion amount of the wire 23 in the bottom layer of the stacked via structure 20. The term "wire end side protrusion amount" as used herein refers to a longest distance among distances from via ends to wire ends along two orthogonal directions along which a wire extends, except a distance along a signal transmission path. In general, the wire end side protrusion amount is the second longest distance of the distances from via ends to wire ends along directions along which a wire extends.

Referring to FIG. 6B, the protrusion amount of the dummy wire 12 is expressed as $(EX2a+EX2b)/2$. Referring to FIG. 6C, the wire end side protrusion amount of the wire 23 in the bottom layer of the stacked via structure 20 is the distance $EX3b$, which is longest among distances each from a via end to a wire end except the distance $EX3a$ extending along a signal transmission path. According to the present embodiment, the protrusion amount of the dummy wire 12, that is $(EX2a+EX2b)/2$, is substantially equal to the wire end side protrusion amount $EX3b$ of the wire 23.

The wire end side protrusion amount $EX3b$ of the wire 23 in the stacked via structure 20 can be reduced to be substantially equal to the protrusion amount $(EX2a+EX2b)/2$ of the dummy wire 12, because the wire 23 has the sufficient distance $EX3a$ on the opposite side to the distance $EX3b$. Thus, the wire end side protrusion amount $EX3b$ of the wire 23 does not need to include margins for assuring the reliability, and thus, it is preferable that $EX3b$ is of minimum dimensions possible in the fabrication process. Besides, as mentioned earlier, dimensions of the dummy wire 12 connected to the dummy via 11 do not need to include margins for assuring the reliability. It is therefore preferable that the dummy wire 12 is of minimum dimensions possible in the fabrication process. In this case, the protrusion amount of the dummy wire 12 is substantially equal to the wire end side protrusion amount of the wire 23.

Figure 7:
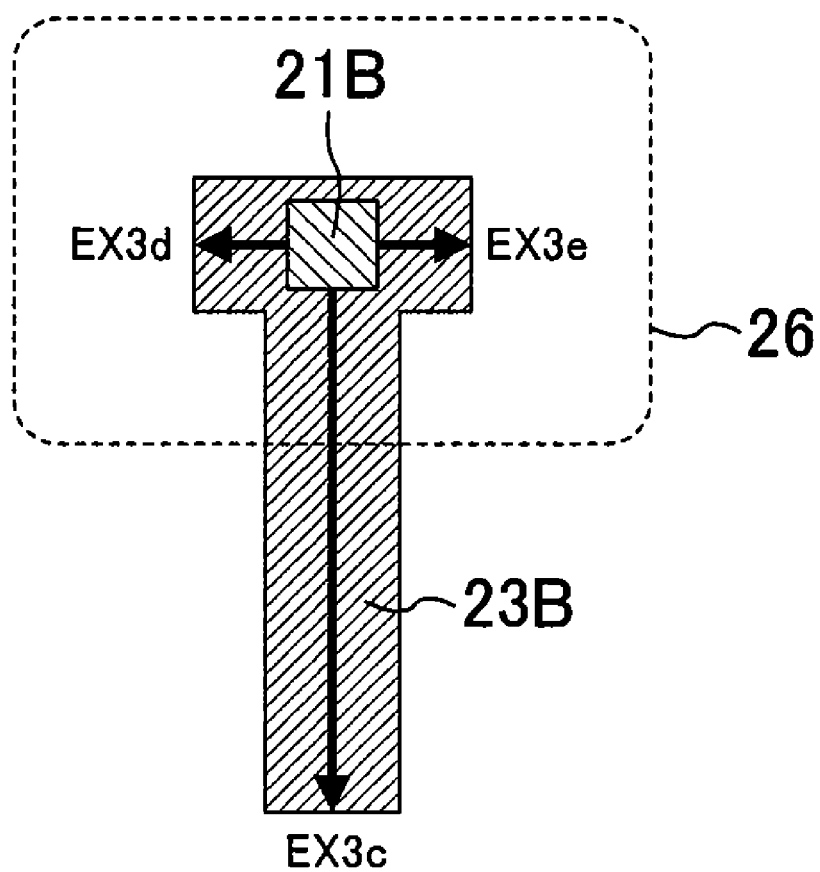
FIG. 7 is a plan view showing another example shape of a wire according to the fifth embodiment.

There are cases in which a wire is T-shaped as shown in FIG. 7. Specifically, the wire end 26 connected to a via 21B extends along a direction orthogonal to a direction along which a wire 23B extends. In this case, the wire end side protrusion amount of the wire 23B is the distance $EX3d$ ($=EX3e$), which is longest among distances each from a via end to a wire end except the distance $EX3c$ extending along a signal transmission path.

In the present embodiment, the protrusion amount of the dummy wire is described as being substantially equal to the wire end side protrusion amount of the wire in the bottom layer of the stacked via structure. However, the protrusion amount of the dummy wire may be substantially equal to the wire end side protrusion amount of a wire in the top layer of the stacked via structure (wire 25 in the structure of FIG. 6).

Sixth Embodiment

According to the above embodiments, the wires in the wiring layers are illustrated as extending along the same direction. However, many of actually-fabricated semiconductor integrated circuit devices have a structure in which wires in wiring layers extend along two orthogonal directions in an alternating manner. The same effects as in the above embodiments are obtainable in this structure too, by providing a wire and a via in the same manner as in the above embodiments.

Figure 8A:
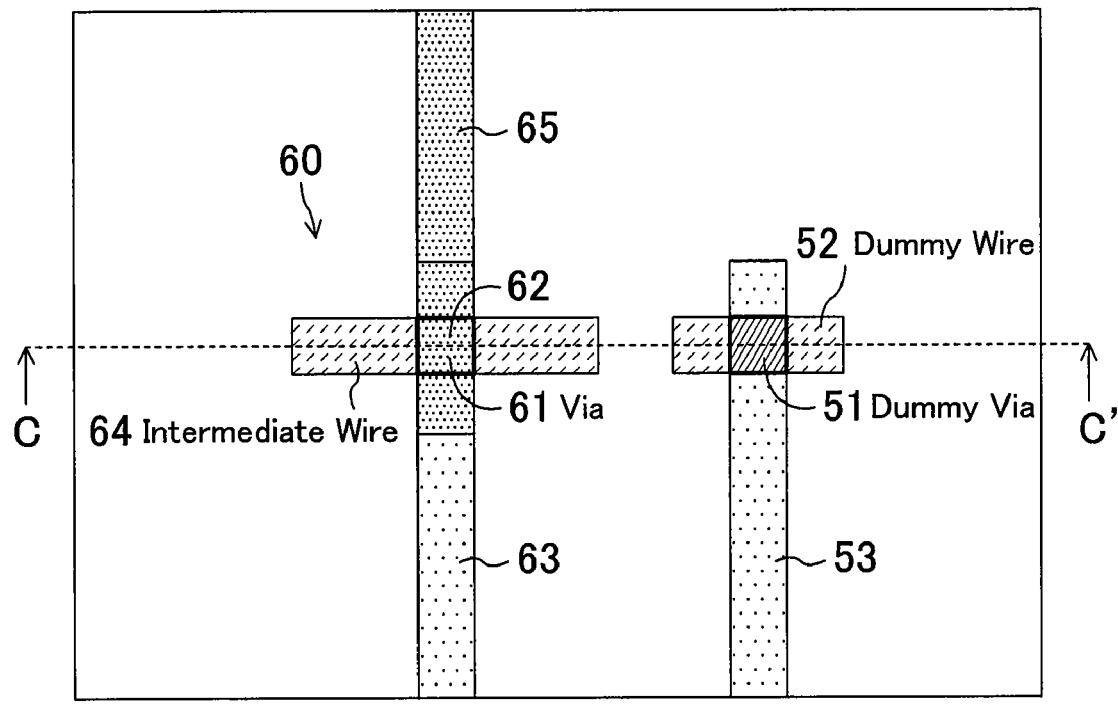
FIG. 8A is a plan view and FIG. 8B is a cross section.
Figure 8B:
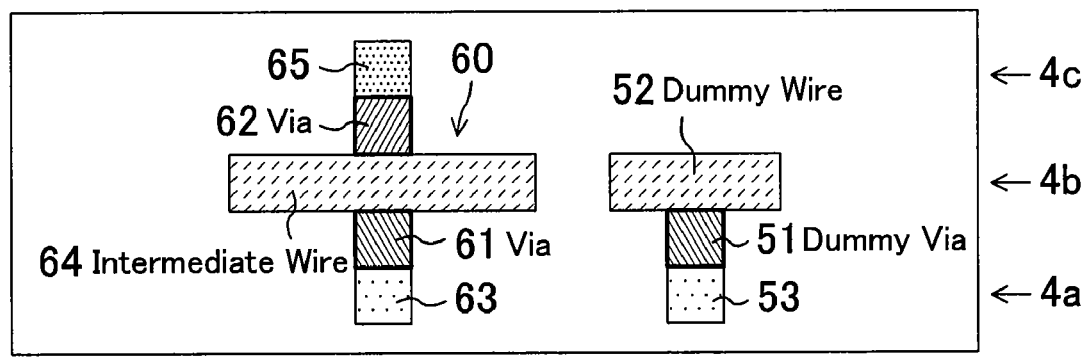

FIG. 8 shows an example structure of a semiconductor integrated circuit device according to the sixth embodiment. FIG. 8A is a plan view and FIG. 8B is a cross section taken along the line C-C' of FIG. 8A. FIG. 8 illustrates the structure in which wires in wiring layers 4a, 4b and 4c extend along two orthogonal directions in an alternating manner.

Referring to FIG. 8, a dummy via 51 exists between the wiring layer 4a (first wiring layer) and the wiring layer 4b (second wiring layer). The dummy via 51 connects between a wire 53 formed in the wiring layer 4a and a dummy wire 52 formed in the wiring layer 4b. A stacked via structure 60 is formed in the wiring layers 4a through 4c. The stacked via structure 60 includes: a via 61 between the wiring layers 4a and 4b; a via 62 between the wiring layers 4b and 4c; a wire 63 formed in the wiring layer 4a and connected to the via 61; an intermediate wire 64 formed in the wiring layer 4b and connected to the vias 61 and 62; and a wire 65 formed in the wiring layer 4c and connected to the via 62.

The dummy wire 52 connected to the dummy via 51 is smaller than the intermediate wire 64 which is included in the stacked via structure 60 and which is formed in the same wiring layer 4b as the dummy wire 52. In other words, the protrusion amount of the dummy wire 52 is smaller than the protrusion amount of the intermediate wire 64. Alternatively, the area of the dummy wire 52 is smaller than the area of the intermediate wire 64.

Seventh Embodiment

According to the above embodiments, one dummy via is connected to the dummy wire. However, two or more dummy vias may be connected to the dummy wire. The same effects as in the above embodiments are obtainable in this structure too, by providing a wire and a via in the same manner as in the above embodiments.

Figure 9A:
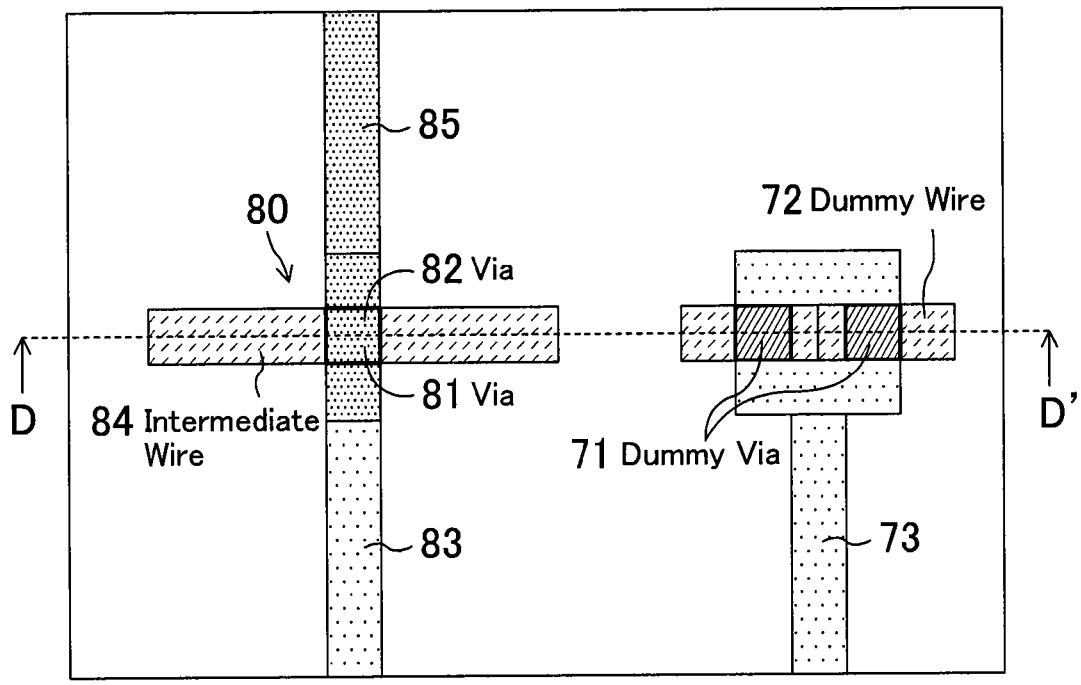
FIG. 9A is a plan view and FIG. 9B is a cross section.
Figure 9B:
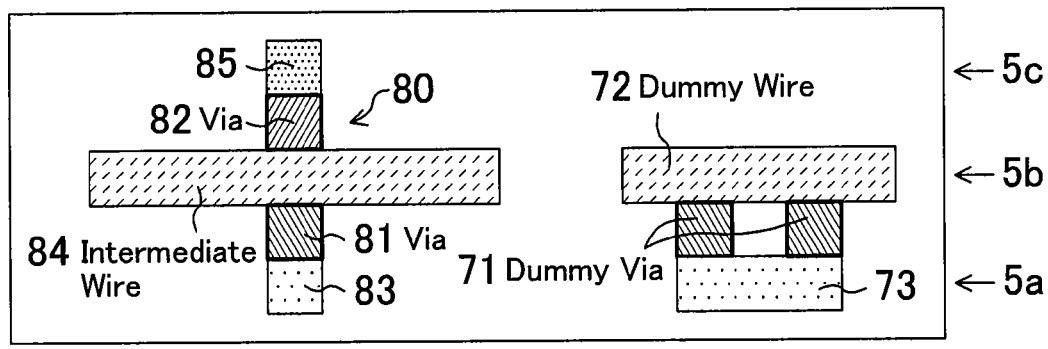

FIG. 9 shows an example structure of a semiconductor integrated circuit device according to the seventh embodiment. FIG. 9A is a plan view and FIG. 9B is a cross section taken along the line D-D' of FIG. 9A. FIG. 9 illustrates the structure in which wires in wiring layers 5a, 5b and 5c extend along two orthogonal directions in an alternating manner. Of course, the wires may extend along the same direction.

Referring to FIG. 9, two dummy vias 71 exist between the wiring layer 5a (first wiring layer) and the wiring layer 5b (second wiring layer). The dummy vias 71 connect between a wire 73 formed in the wiring layer 5a and a dummy wire 72 formed in the wiring layer 5b. A stacked via structure 80 is formed in the wiring layers 5a through 5c. The stacked via structure 80 includes: a via 81 between the wiring layers 5a and 5b; a via 82 between the wiring layers 5b and 5c; a wire 83 formed in the wiring layer 5a and connected to the via 81; an intermediate wire 84 formed in the wiring layer 5b and connected to the vias 81 and 82; and a wire 85 formed in the wiring layer 5c and connected to the via 82.

The dummy wire 72 connected to the dummy vias 71 is smaller than the intermediate wire 84 which is included in the stacked via structure 80 and which is formed in the same wiring layer 5b as the dummy wire 72. In other words, the protrusion amount of the dummy wire 72 is smaller than the protrusion amount of the intermediate wire 84. In the case where two or more dummy vias are connected to a dummy wire, the protrusion amount of the dummy wire is determined according to the definition given in the above by selecting an arbitrary one of the dummy vias. Alternatively, the area of the dummy wire 72 is smaller than the area of the intermediate wire 84.

Although in FIG. 9 the wires in the wiring layers 5a, 5b and 5c extend along two orthogonal directions in an alternating manner, the wires may, of course, extend along the same direction.

The above embodiments are described by using drawings in which only one stacked via structure is illustrated. However, two or more stacked via structures, each of which includes an intermediate wire formed in the same wiring layer as a dummy wire, may be provided. In this case, according to the present invention, the protrusion amount or the area of the dummy wire is smaller than the protrusion amount or the area of the intermediate wire, which is formed in the same wiring layer as the dummy wire, in any of the stacked via structures.

Even if wires are designed to have same dimensions, the actually-fabricated wires may have different dimensions due to process variations during the actual fabrication process. Hence, the difference in protrusion amount or area between a dummy wire and an intermediate wire is not always the same because of the process variations.

According to the present invention, it is possible to suppress problems, such as reduction in designability and increase in fabrication cost which result from the existence of a dummy wire connected to a dummy via, more than it was possible in a semiconductor integrated circuit device including the dummy via. The present disclosure is thus useful for improving performance of LSIs and reducing costs.

What is claimed is:

1. A semiconductor integrated circuit device, comprising:
a substrate;
three or more wiring layers on the substrate;
a dummy via between adjacent first and second wiring layers of the three or more wiring layers;
a dummy wire formed in the second wiring layer and connected to the dummy via; and
one or more stacked via structures formed in the three or more wiring layers, each of the one or more stacked via structures including an intermediate wire in the second wiring layer, a first via between the first wiring layer and the second wiring layer, and a second via between the second wiring layer and a third wiring layer, the first via and the second via being connected to the intermediate wire, the first via and the second via at least partially overlapping with one another in plan view,
wherein a protrusion amount of the dummy wire is smaller than a protrusion amount of the intermediate wire in any of the stacked via structures.

2. The semiconductor integrated circuit device of claim 1, wherein the protrusion amount of the dummy wire is substantially equal to a wire end side protrusion amount of a wire formed in a top or bottom layer of any one of the stacked via structures.

3. The semiconductor integrated circuit device of claim 1, wherein the second wiring layer in which the dummy wire is formed is above the dummy via.

4. The semiconductor integrated circuit device of claim 1, wherein the second wiring layer in which the dummy wire is formed is below the dummy via.

5. The semiconductor integrated circuit device of claim 1, wherein the dummy via is connected to a wire which is included in any one of the stacked via structures and which is formed in the first wiring layer.

6. The semiconductor integrated circuit device of claim 1, wherein the dummy via has a smaller cross-sectional area than any via included in the stacked via structures.

7. The semiconductor integrated circuit device of claim 1, wherein the dummy via connected to the dummy wire includes two or more dummy vias.

8. The semiconductor integrated circuit device of claim 1, wherein a protrusion amount of the dummy wire is a longer one of two averages of distances from via ends to wire ends respectively along two orthogonal directions along which the dummy wire extends.

* * * * *